United States Patent
Berntsen

(10) Patent No.: US 10,489,319 B2
(45) Date of Patent: Nov. 26, 2019

(54) AUTOMATIC TRANSMISSION OF DUMMY BITS IN BUS MASTER

(71) Applicant: Atmel Corporation, San Jose, CA (US)

(72) Inventor: Eivind Berntsen, Trondheim (NO)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/793,911

(22) Filed: Oct. 25, 2017

(65) Prior Publication Data

US 2018/0173657 A1    Jun. 21, 2018

Related U.S. Application Data

(60) Provisional application No. 62/437,015, filed on Dec. 20, 2016.

(51) Int. Cl.
| G06F 13/28 | (2006.01) |
| G06F 13/42 | (2006.01) |
| G06F 12/06 | (2006.01) |

(52) U.S. Cl.
CPC .......... *G06F 13/28* (2013.01); *G06F 12/0623* (2013.01); *G06F 13/4291* (2013.01); *G11C 2216/30* (2013.01)

(58) Field of Classification Search
CPC ............ G06F 17/5054; G06F 15/7867; G06F 2217/68; G06F 8/20
USPC .............. 326/86; 710/302, 308, 266, 3, 48, 8
See application file for complete search history.

(56) References Cited

U.S. PATENT DOCUMENTS

| 4,739,323 A * | 4/1988 | Miesterfeld ........... G06F 13/385 370/447 |
| 5,991,304 A * | 11/1999 | Abramson ............ G06F 13/385 370/413 |
| 6,041,060 A * | 3/2000 | Leichty ............... H04L 12/5602 370/229 |
| 7,409,485 B1 * | 8/2008 | Sartin ................... G06F 13/128 710/106 |
| 7,478,186 B1 * | 1/2009 | Onufryk ................. G06F 13/24 710/263 |
| 7,849,229 B2 | 12/2010 | Escamilla |
| 9,442,873 B2 | 9/2016 | Birsan et al. |
| 2003/0101307 A1 * | 5/2003 | Gemelli .............. G06F 17/5045 710/305 |
| 2006/0248240 A1 * | 11/2006 | Ishii ........................ G06F 13/28 710/22 |
| 2007/0019636 A1 * | 1/2007 | Lau ........................ G06F 13/385 370/360 |

(Continued)

*Primary Examiner* — Faisal M Zaman
(74) *Attorney, Agent, or Firm* — Fish & Richardson P.C.

(57) ABSTRACT

Various embodiments are disclosed for automatic transmission of dummy bits in a serial bus master. The disclosed embodiments allow a single DMA descriptor to be fetched from memory for the reception of a specified amount of data. Dummy bits can be located or generated in the serial bus master either as a user configurable value or a default value. Logic in the serial bus master initiates a data transfer by writing a count value representing an amount of data to be received to a count register in the serial bus master. The single DMA descriptor is then configured to handle the internal transfer of bits received by the serial bus master from a serial bus slave and the DMA controller is enabled. When data transfer is initiated, the serial bus master starts sending dummy bits to the serial bus slave and receiving data bits from the serial bus slave.

2 Claims, 4 Drawing Sheets

(56) References Cited

U.S. PATENT DOCUMENTS

| | | | | |
|---|---|---|---|---|
| 2009/0103380 A1* | 4/2009 | Pekny | ................ | G06F 13/4291 |
| | | | | 365/201 |
| 2011/0311221 A1* | 12/2011 | Mukai | .................. | H04J 3/1694 |
| | | | | 398/25 |
| 2012/0089759 A1* | 4/2012 | Shirlen | ................ | G06F 13/362 |
| | | | | 710/113 |
| 2015/0074312 A1* | 3/2015 | Barus | ................ | G06F 13/4027 |
| | | | | 710/306 |
| 2015/0163269 A1* | 6/2015 | Ryu | ....................... | H04L 67/38 |
| | | | | 709/204 |
| 2017/0060453 A1* | 3/2017 | Kodera | ................ | G06F 3/0619 |
| 2017/0168980 A1* | 6/2017 | Kilzer | ...................... | G06F 1/10 |

* cited by examiner

AUTOMATIC TRANSMISSION OF DUMMY BITS IN BUS MASTER

CROSS-REFERENCE TO RELATED APPLICATION

This application claims priority to U.S. Provisional Application No. 62/437,015, filed Dec. 20, 2016, the entire contents of which are incorporated herein by reference.

TECHNICAL FIELD

The subject matter of this disclosure relates generally to direct memory access controllers and serial communication bus protocols.

BACKGROUND

Direct memory access (DMA) is a feature of computer systems that allows hardware subsystems to access main system memory independently of the central processing unit (CPU). Some DMA transfers are based on descriptors, which hold transfer properties such as the source and destination addresses, transfer counter and other additional transfer control information. The descriptors can be static or linked. When static, a single block transfer is performed. When linked, a number of transfer descriptors can be used by a DMA controller (DMAC) to enable multiple block transfers within a single DMA transaction. Descriptors are often stored in system memory, such as static random-access memory (SRAM).

Serial peripheral interface (SPI) is a synchronous serial communication interface used for short distance communication. In some microcontrollers, when performing a DMA transfer to an SPI device it is necessary for the DMAC to write to a data register in the SPI master in order to receive data from the SPI slave. To perform the DMA transfer, the DMAC also needs to write descriptors back and forth between itself and system memory placing a burden on system resources.

SUMMARY

Various embodiments are disclosed for automatic transmission of dummy bits in a serial bus master. The disclosed embodiments allow a single DMA descriptor to be fetched from memory by a DMAC for the reception of a specified amount of data. Dummy bits can be located or generated in the serial bus master either as a user configurable value or a default value. Logic in the serial bus master initiates a data transfer by writing a count value representing an amount of data to be received to a count register in the serial bus master. The single DMA descriptor is then configured to handle the internal transfer of bits received by the serial bus master from a serial bus slave and the DMA controller is enabled. When data transfer is initiated, the serial bus master starts sending dummy bits to the serial bus slave and receiving data bits from the serial bus slave. When the data bits are received, control logic in the serial bus master decrements a count value (or increments) in count register and signals to the DMAC or a central processing unit (CPU) that new data was received from the serial bus slave. The DMAC or CPU then fetches the data from a buffer or register in the serial bus master. When the fetch is completed, the serial bus master starts sending dummy bits again and receiving new data bits from the serial bus slave. This process continues until the count in the count register reaches a threshold value.

In an embodiment, a method comprises: transferring, by a master over a serial bus, a first set of dummy bits to a slave coupled to the serial bus; receiving, by the master over the serial bus, a first set of data bits from the slave; storing, by the master, the first set of data bits; adjusting, by the master, a count value for tracking a number of data transfers received from the slave over the serial bus; signaling, by the master that the first set of data has been received; transferring, by the master over the serial bus, a second set of dummy bits to the slave; receiving, by the master over the serial bus, a second set of data bits from the slave; storing, by the master, the second set of data bits; adjusting, by the master, the count value for tracking the number of data transfers over the serial bus; and signaling that the second set of data has been received.

In an embodiment, an apparatus comprises: circuitry configured to exchange data over a serial bus, the data exchange including transferring a first set of dummy bits to a slave coupled to the serial bus and receiving a first set of data bits from the slave; a buffer configured to store the first set of data bits; and control logic configured to adjust a count value for tracking a number of data transfers received from the slave over the serial bus, and for signaling to a DMAC or CPU that the first set of data has been received.

DETAILED DESCRIPTION

Example System

Figure 1:
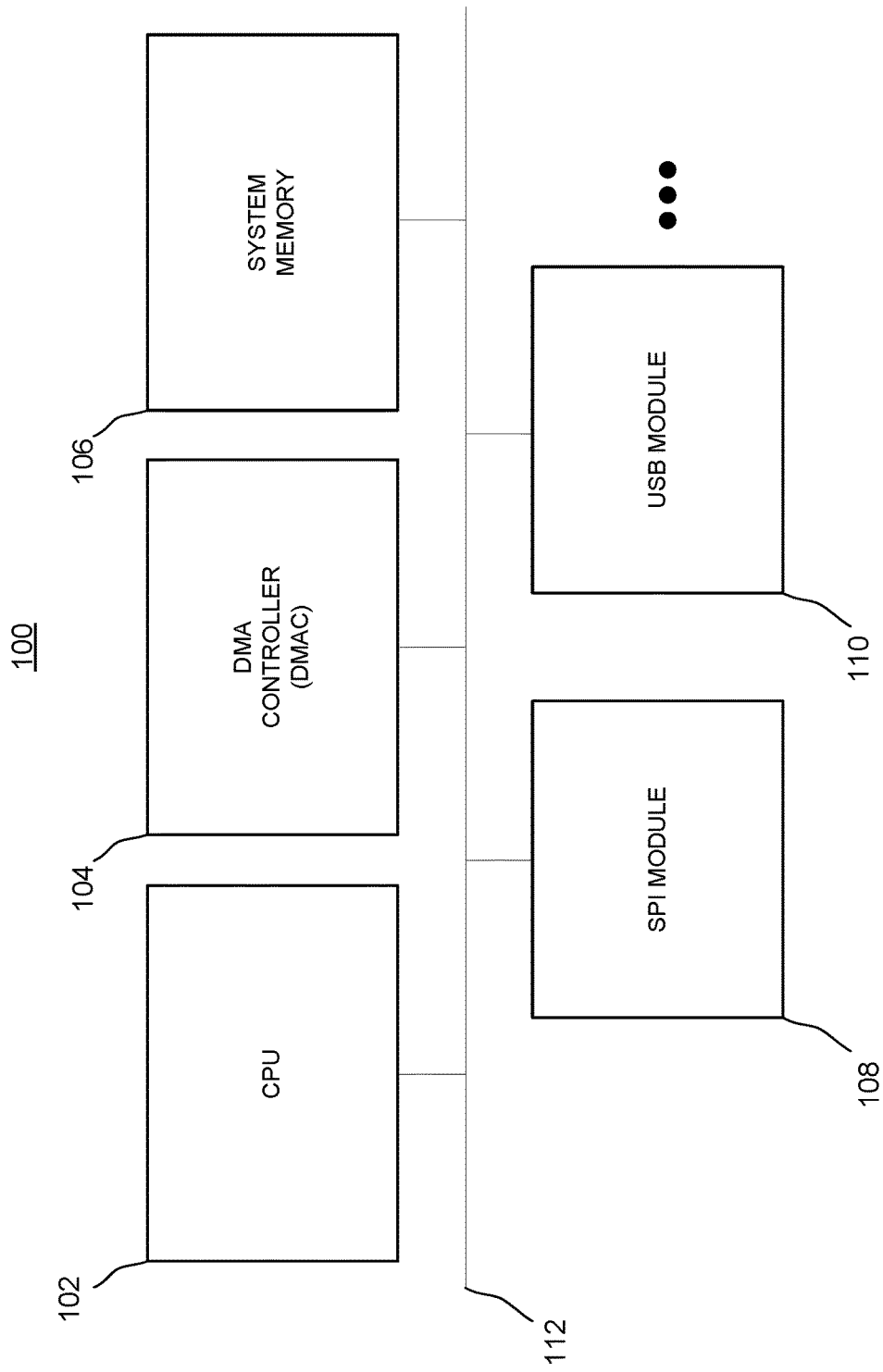
FIG. 1 is a block diagram of an example microcontroller system that includes a DMAC and SPI module, according to an embodiment.

FIG. 1 is a system block diagram of an example microcontroller system that includes a DMAC and SPI module, according to an embodiment. Microcontroller system 100 includes CPU 102, DMAC 104, system memory 106 (e.g., SRAM), SPI module 108 and universal serial bus (USB) module 110. Each of these modules are coupled to system bus 112. Other embodiments of system 100 can include more or fewer modules, additional system or peripheral buses, bus bridges, controllers, memory, clock hardware, interface hardware, power circuitry, etc. Although the description that follows is directed to SPI protocol, the disclosed embodiments are applicable to any data exchange protocol that uses dummy bits to initiate a transfer on a serial bus between a serial bus master and a serial bus slave.

DMAC 104 manages DMA transactions between system memory 106 and peripherals, such as SPI module 108 and USB module 110. DMAC 104 can support peripheral to peripheral, peripheral to memory, memory to peripheral and memory to memory data transfers. In some embodiments, the basic transfer unit is a beat, which is defined as a single bus transaction. There can be multiple beats (a "burst") in a single block transfer and multiple block transfers in a DMA transaction.

SPI module 108 communicates in full duplex mode using a master-slave architecture. For the discussion that follows, SPI module 108 is operating as an SPI master, which communicates with an SPI slave. SPI module 108 originates a frame for reading and writing. Multiple SPI slave devices can be supported by SPI module 108 through selection with individual slave select lines. Due to the nature of the SPI protocol, dummy bits must be transmitted to the selected SPI slave in order to receive data from the SPI slave. When DMAC 104 works with multiple descriptors (e.g., linked descriptors) during SPI data reception DMAC 104 will first write back the current descriptor to system memory 106, which takes a number of cycles (e.g., five cycles). DMAC 104 will then read a new descriptor from system memory 106 which will take additional cycles (e.g., each descriptor can be 128 bits). Because DMAC 104 is working with system memory 106, the descriptor transfer operations can prevent access to system bus 112 by other masters, such as CPU 102 and USB 110. In addition, DMAC 104 also fetches dummy bits for each block transfer from system memory 106, creating an additional burden on system resources.

Figure 2:
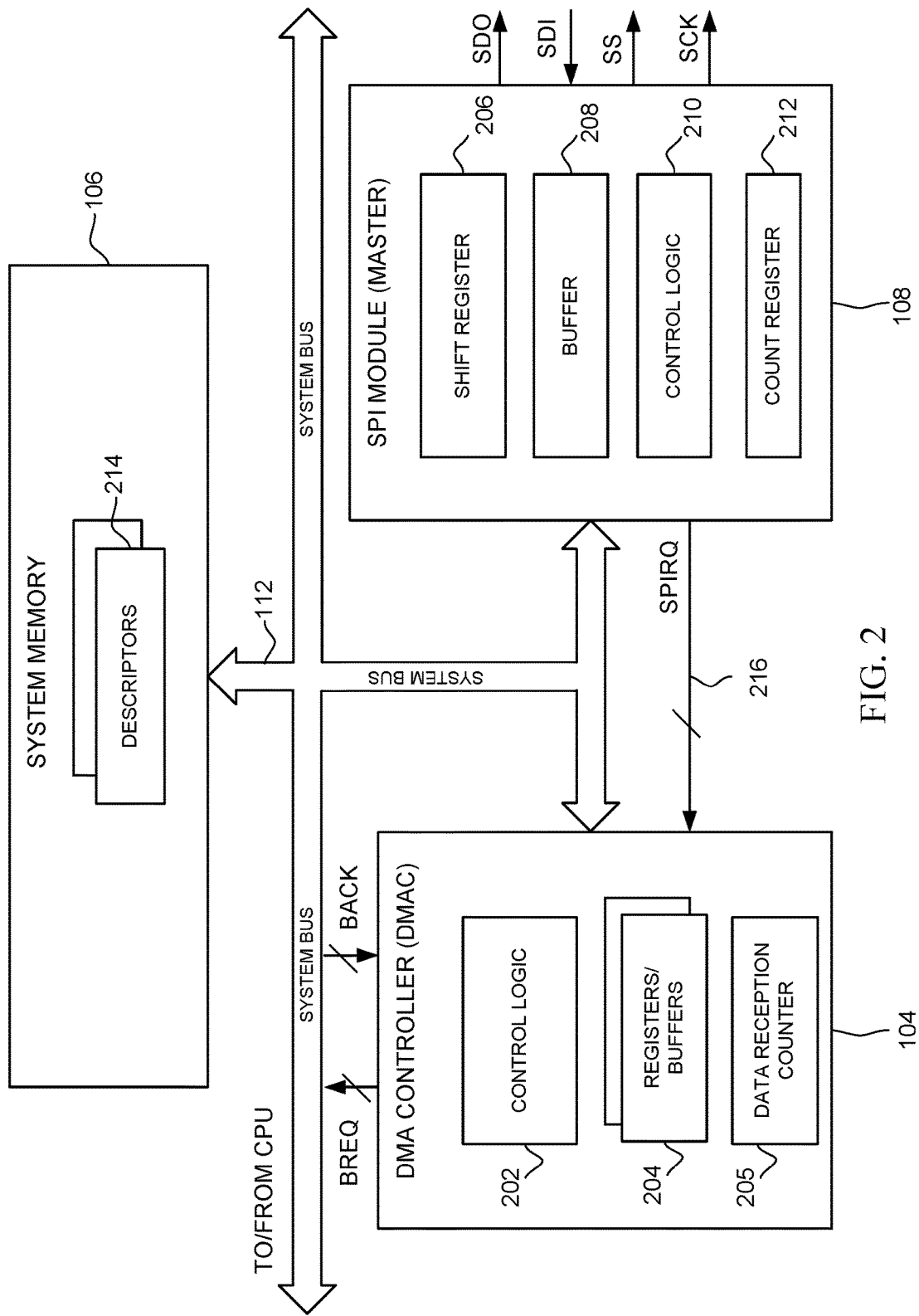
FIG. 2 is a block diagram of an example DMAC and SPI module configured for automatic transmission of dummy bits by the SPI module, according to an embodiment.

FIG. 2 is a block diagram of an example DMAC and SPI module configured for automatic transmission of dummy bits by the SPI module, according to an embodiment. DMAC 104 includes control logic 202, registers/buffers 204 and data reception counter 205. SPI module 108 includes shift register 206, buffer 208, control logic 210 and count register 212. System memory 106 includes DMA descriptors 214. A DMA descriptor holds transfer properties, such as the source and destination addresses, transfer counter and other additional transfer control information. DMAC 104, SPI module 108 and system memory 106 are each coupled to system bus 112.

A DMA transfer may be initiated when a DMA transfer request is detected. A transfer request can be triggered by, for example, a user program (e.g., software), a peripheral device, in response to an event from an event system, or a combination thereof. In the example shown, SPI module 108 provides an interrupt signal SPIRQ to DMAC 104 to initiate a DMA transfer. In some implementations, a DMA transfer request is for transferring data from system memory 106 to a SPI slave (not shown) or for transferring data from an SPI slave to system memory 106. In the following example, the DMA transfer request is to transfer data from an SPI slave to system memory 106.

DMAC 104 accesses system bus 112 using bus request and acknowledge signals BREQ, BACK. In some embodiments, descriptors can be transferred to and from system memory 106 over a separate interface rather than using system bus 112. Control logic 202 controls the functions of DMAC 104 including the transfer of DMA descriptors 214 to and from system memory 106 and data transfer to and from SPI module 108. In an embodiment, control logic 202 implements a channel arbiter, which receives transfer requests for DMA channels and based on channel priority levels and a scheduling scheme, and selects one of the DMA channels as an active DMA channel for data transfer. DMA descriptors 214 and data blocks that are received/transmitted by DMAC 104 are stored in registers/buffers 204. Data reception counter 205 is used to count the number of data units (e.g., number of bytes) received by DMAC 104 from a peripheral device.

SPI module 108 communicates with one or more SPI slaves (not shown) using an interface that includes, for example, serial data input (SDI), serial data output (SDO), slave select (SS) and slave clock (SCK) lines. The SCK line provides a clock for synchronization with a selected SPI slave. The clock controls when data can change and when data is valid for reading. All SPI slaves are controlled by the clock provided on the SCK line. Because SPI is a data exchange protocol, as data is being clocked out, new data is also being clocked in. These data exchanges are controlled by the SCK line. The SS line provides a slave select signal (e.g., an active low signal) that indicates to an SPI slave that SPI module 108 wishes to start a data exchange between with the SPI slave. The data can be exchanged during the rising or falling edge of the SCK clock. SPI module 108 creates a data loop between itself and the SPI slave. Data leaving SPI module 108 exits on the SDO line. Data entering SPI module 108 enters on the SDI line. Shift register 206 shifts data in and out of SPI module 108 on the SDI and SDO lines, respectively. Buffer 208 stores data exchanged between SPI module 108 and the SPI slave. Writing to buffer 208 will transfer the contents of buffer 208 to shift register 206 and initiate SPI transfer.

Control logic 210 determines when SPI transfer can take place. Control logic 210 transmits the clock and slave select signal. The SPI slave waits for these signals and uses them when processing the SPI data. SPI module 108 can include other registers, such as a register for indicating overflow error, a register for controlling clock polarity to determine if the clock will idle high or low, a register for configuring SPI module 108 into a master mode or slave mode, a register for controlling sample timing, a register for indicating when buffer 208 is full and a register for selecting a clock edge for data exchange.

In an embodiment, count register 212 is included in SPI module 108. In other embodiments, DMA reception counter 201 in DMAC 104 can be used as count register 212. Including count register 212 in SPI module 108 will further reduce the burden on CPU 102. Count register 212 stores a count value representing the amount of data to be received in the DMA transfer.

In an example operation, a user program starts the data transfer by writing a count value representing the amount of data to be received to counter register 212 in SPI module 108. This can be done by CPU 102 or DMAC 104 using a control packet. The user program then configures a single DMA descriptor to handle the internal transfer of each received block of data (e.g., 8 or 9 bits of data) and enables DMAC 104. SPI module 108 starts the transfer by sending dummy bits (e.g., 8 or 9 dummy bits) to the SPI slave. In some embodiments, the dummy bits can be located in system memory 108. In other embodiments, the dummy bits can be located or generated in SPI module 108 either as a user configurable value or a default value to limit access to system memory 108 for the dummy bits. Control logic 210 in SPI module 108 initiates SPI transfer. In an embodiment, the dummy bits can be a register value in SPI module 108 that a user program writes to before starting transmission with the DMAC. In another embodiment, the dummy bits can be hardcoded (e.g., 0X00h), which is less expensive than a register to implement but provides less options for a user program. It is also possible in some implementations to always send back the same data as received. In each case, the dummy bits are present in SPI module 108 and do not need a bus or memory access to be retrieved.

When the desired amount of data is received by SPI module 108 on the SDI line (e.g., 8 or 9 bits of data), control logic 210 stores the received data in buffer 208, adjusts the count in count register 212 by one, and then signals DMAC 104 (e.g., using the SPIRQ line) that new data is received and ready to be fetched from buffer 208. In response to the signal, DMAC 104 or CPU 102 fetches the data from buffer 208 (or a register). Once the fetch is completed, control logic 210 starts sending the dummy bits again, receives and stores the new data into buffer 208 or register, and then signals DMAC 104 or CPU 102 that new data is received and ready to be fetched from buffer 208 or register. This process continues until the count value in count register 212 is zero. For example, after the count value is incremented or decremented the count value is compared against a maximum or minimum comparison value (e.g., zero) and the counting stops when the comparison value is reached (e.g., when zero is reached if decrementing the count value). In some embodiments, the count value can be decremented to a minimum count value other than zero. In some embodiments, the count value can be incremented from zero or other minimum count value to a maximum count value. In some embodiments, an n-bit hardware counter with reset capability can be implemented rather than count register 212. In an embodiment, control logic 210 is configured to detect a read out of buffer 208 by the DMAC or CPU 102 so that the data in buffer 208 is not overwritten by dummy bits at the start of the next SPI transfer.

Figure 3:
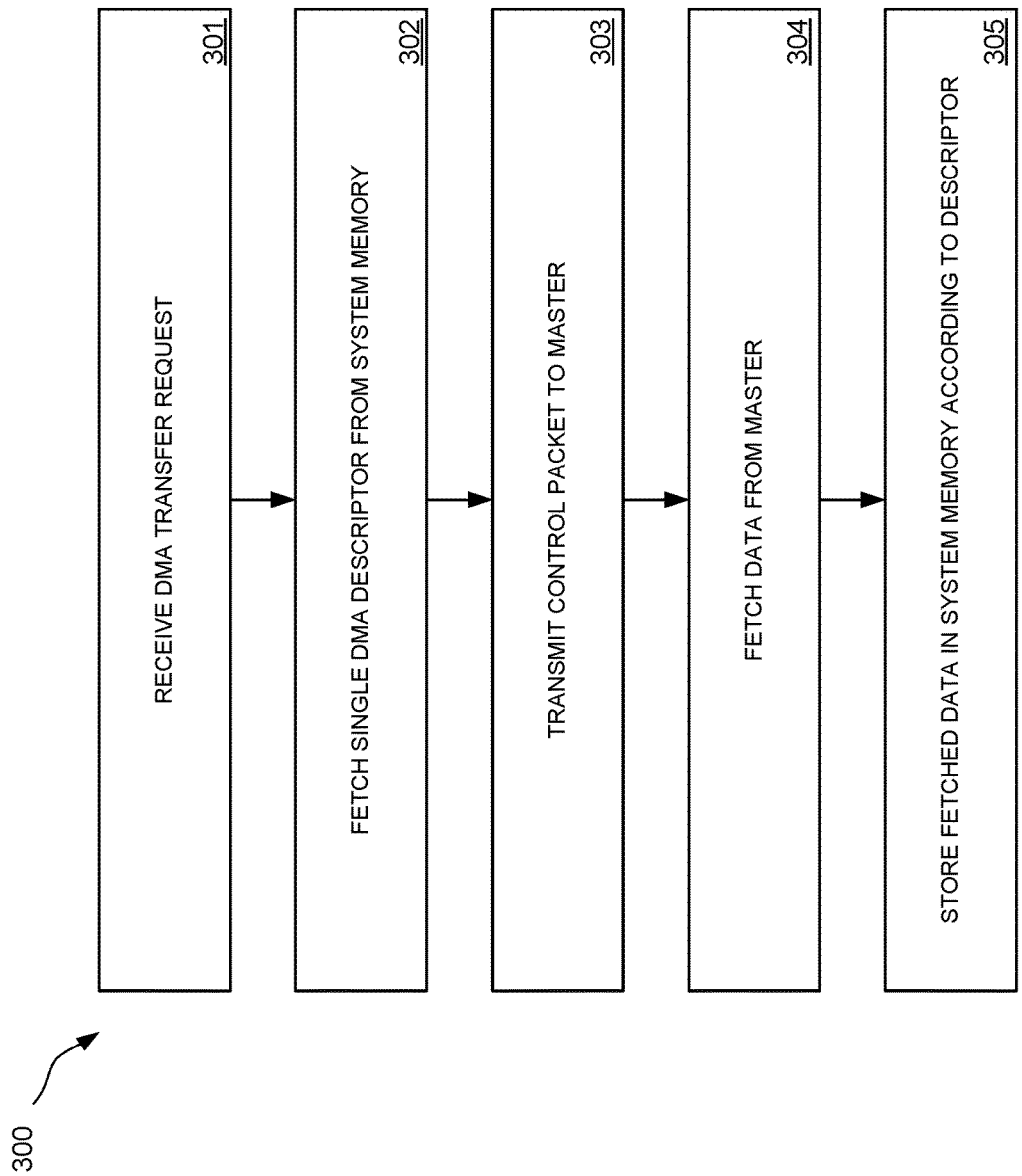
FIG. 3 is a flow diagram of an example DMAC process for automatic transmission of dummy bits by the SPI module, according to an embodiment.

FIG. 3 is a flow diagram of an example DMAC process for automatic transmission of dummy bits by a SPI module, according to an embodiment. Process 300 can be implemented using system 100 and the configuration described in reference to FIG. 2.

In an embodiment, process 300 can begin by receiving a DMA transfer request (301). A DMA transfer request can be triggered by, for example, a user program (e.g., software), a peripheral device, in response to an event, or a combination thereof.

Process 300 can continue by fetching a single DMA descriptor from system memory (302). DMA descriptors stored in system memory can be accessed by a DMAC over the system bus or a separate interface with the system memory. The use and management of descriptors by a DMAC is described in further detail in U.S. Pat. No. 9,442,873, which issued to Atmel Corporation, San Jose, Calif. (US) on Sep. 13, 2016, and which patent is incorporated by reference herein in its entirety.

Process 300 can continue by transmitting a control packet to the SPI master (303). The DMA descriptor holds transfer properties such as the source and destination addresses, transfer counter and other additional transfer control information.

Process 300 can continue by fetching data from the SPI master (304). For example, in response to a signal from the SPI master, the DMAC can fetch data from a buffer in the SPI master and store the data in a buffer or register in the DMAC. In an embodiment, a data reception counter can be incremented each time data is received to allow the DMAC to keep track of transfer progress.

Process 300 can store the fetched data in system memory according to the DMA descriptor (305). After the data is stored in a buffer in the DMAC the data is transferred to system memory over the system bus where it can be accessed by, for example, the user program that requested the transfer.

Figure 4:
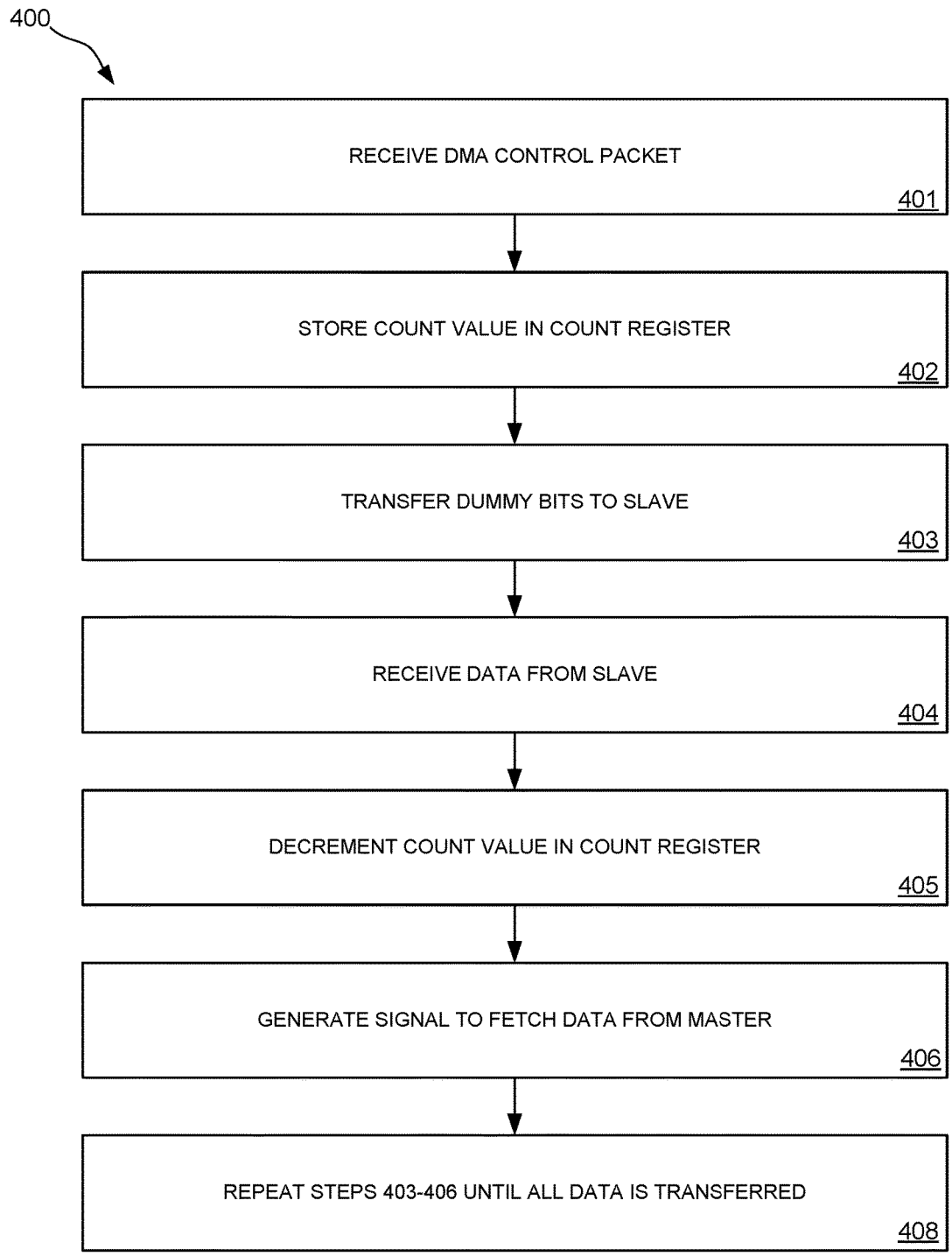
FIG. 4 is a flow diagram of an example SPI module process for automatic transmission of dummy bits by the SPI module, according to an embodiment.

FIG. 4 is a flow diagram of an example SPI module process for automatic transmission of dummy bits by the SPI module, according to an embodiment. Process 400 can be implemented using system 100 and the configuration described in reference to FIG. 2.

In an embodiment, process 400 can begin by receiving a DMA control packet (401). For example, a DMAC can send a control packet to a SPI module to configure the SPI module for SPI transfer, including writing to one or more configuration registers in the SPI module. In an embodiment, a CPU can configure the SPI module for SPI transfer. The one or more configuration registers can be used by control logic in the SPI module to configure the SPI module into a master mode and to generate an appropriate slave select signal for selecting the correct SPI slave for the SPI transfer.

Process 400 can continue by storing a count value into a count register in the SPI module to enable the automatic transmission of dummy bits (402). The count value can be provided by the DMAC (e.g., in the control packet) or by the CPU. In embodiments where the DMAC data reception counter is used to track transfers, step 402 can be omitted.

Process 400 can continue by transferring dummy bits (e.g., 8 to 9 dummy bits) to the SPI slave (403). The number of dummy bits depends on the amount of data to be transferred, which can be determined by, for example, the user program that requested the transfer.

Process 400 can continue by receiving data from the SPI slave (e.g., 8 to 9 data bits) in a synchronized SPI data exchange (404), and then adjusting (e.g., decrementing or incrementing) the count value in the count register by one after each set of bits is received (405).

Process 400 can continue by signaling the DMAC or the CPU that new data has been received and is ready to be fetched (405), then repeating steps 403-405 until the count value in the count register reaches a comparison threshold value (e.g., zero or a maximum count value). In some embodiments, the count value can be decremented to a minimum count value other than zero. In some embodiments, the count value can be incremented from zero or other minimum count value to a maximum count value. In some embodiments, an n-bit hardware counter with reset capability can be implemented rather than count register.

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method comprising:
obtaining, by a direct memory access (DMA) controller (DMAC), a single DMA descriptor from a system memory for a data transfer over a serial bus, the serial bus coupled to a serial peripheral interface (SPI) master and a SPI slave, the single DMA descriptor including a count value for tracking a number of data unit transfers received by the SPI master from the SPI slave over the serial bus during the data transfer;
automatically and without accessing the system memory for another DMA descriptor for the data transfer:

transferring, by the SPI master over the serial bus, a first set of dummy bits to the SPI slave coupled to the serial bus;
receiving, by the SPI master over the serial bus, a first set of data bits from the SPI slave;
storing, by the SPI master, the first set of data bits in a buffer;
adjusting, by the SPI master, the count value for tracking the number of data unit transfers received from the SPI slave over the serial bus;
signaling, by the SPI master to the DMAC, that the first set of data bits have been received;
transferring, by the SPI master over the serial bus, a second set of dummy bits to the SPI slave;
receiving, by the SPI master over the serial bus, a second set of data bits from the SPI slave;
storing, by the SPI master, the second set of data bits in the buffer;
adjusting, by the SPI master, the count value for tracking the number of data unit transfers over the serial bus; and
signaling, by the SPI master to the DMAC, that the second set of data bits have been received.

2. A microcontroller unit comprising:
system memory;
a serial bus;
a serial peripheral interface (SPI) master coupled to the serial bus;
an SPI slave coupled to the serial bus;
a direct memory access (DMA) controller (DMAC) coupled to the system memory and the SPI master, the DMAC configured to obtain a single DMA descriptor from the system memory for a data transfer, the single DMA descriptor including a count value for tracking a number of data unit transfers received from the SPI slave over the serial bus during the data transfer;
the SPI master configured to automatically and without accessing the system memory for another DMA descriptor for the data transfer:
  transfer over the serial bus a first set of dummy bits to the SPI slave;
  receive over the serial bus a first set of data bits from the SPI slave;
  store the first set of data bits in a buffer;
  adjust the count value;
  signal to the DMAC, that the first set of data bits have been received;
  transfer to the SPI slave a second set of dummy bits;
  receive over the serial bus a second set of data bits from the SPI slave;
  store the second set of data bits in the buffer;
  adjust the count value; and
  signal to the DMAC that the second set of data bits have been received.

\* \* \* \* \*